US008362590B2

(12) United States Patent
Kanschat (10) Patent No.: US 8,362,590 B2
(45) Date of Patent: Jan. 29, 2013

(54) POWER SEMICONDUCTOR COMPONENT INCLUDING A POTENTIAL PROBE (75) Inventor: Peter Kanschat, Soest (DE)

(73) Assignee: Infineon Technologies AG, Neubiberg (DE)

( * ) Notice: Subject to any disclaimer, the term of this patent is extended or adjusted under 35 U.S.C. 154(b) by 153 days.

(21) Appl. No.: 12/844,289

(22) Filed: Jul. 27, 2010

(65) Prior Publication Data

US 2011/0025406 A1 Feb. 3, 2011

(30) Foreign Application Priority Data

Jul. 28, 2009 (DE) .................. 10 2009 028 049

(51) Int. Cl.
H01L 21/02 (2006.01)

(52) U.S. Cl. ... 257/534; 257/48; 257/734; 257/E23.169; 257/E23.179

(58) Field of Classification Search .................. 257/534, 257/48, 544, 734
See application file for complete search history.

(56) References Cited

U.S. PATENT DOCUMENTS

| 4,980,740 | A  | * | 12/1990 | Pattanayak et al. ........... 257/129 |
| 5,500,541 | A  |   | 3/1996  | Terashima et al. |
| 6,914,297 | B2 |   | 7/2005  | Deboy et al. |
| 2005/0260775 | A1 | * | 11/2005 | DiBattista et al. ............... 438/4 |
| 2006/0163652 | A1 |   | 7/2006  | Lowis |
| 2008/0063566 | A1 | * | 3/2008  | Matsumoto et al. .......... 422/68.1 |
| 2010/0140658 | A1 | * | 6/2010  | Koyama et al. ................ 257/140 |
| 2011/0210956 | A1 | * | 9/2011  | Girdhar et al. ................. 345/212 |
| 2011/0254010 | A1 | * | 10/2011 | Zhang .............................. 257/66 |
| 2012/0007075 | A1 | * | 1/2012  | Wang et al. ...................... 257/48 |

FOREIGN PATENT DOCUMENTS

| DE | 4444595 C2 | 7/1998 |
| DE | 10063135 A1 | 10/2002 |
| DE | 10151326 A1 | 5/2003 |
| DE | 10234493 B3 | 2/2004 |
| JP | 11266016 A | 9/1999 |

OTHER PUBLICATIONS

Ruething et al., "600 V Reverse Conducting Trench Field—Stop IGBT for Drives Applications in Thin Wafer Technology", PCIM 2008, Neubiberg.
Jenni et al, "Traegerverfahren, Drehzeigermodulation", Hochschulverlag AG an der ETH Zurich and B.G. Teubner Stuttgart, 1995.

* cited by examiner

Primary Examiner — A. Sefer
(74) Attorney, Agent, or Firm — Murphy, Bilak & Homiller, PLLC (57) ABSTRACT A power semiconductor component including a semiconductor body and two load terminals is provided. Provided furthermore is a potential probe positioned to tap an electric intermediate potential of the semiconductor body at a tap location of the semiconductor body for an electric voltage applied across the two load terminals, the intermediate potential being intermediate to the electric potentials of the two load terminals, but differing from each of the two electric potentials of the two load terminals.

19 Claims, 4 Drawing Sheets

POWER SEMICONDUCTOR COMPONENT INCLUDING A POTENTIAL PROBE

PRIORITY CLAIM

This application claims priority to German Patent Application No. 10 2009 028 049.9-33 filed Jul. 28, 2009, which is incorporated by reference herein in its entirety.

FIELD OF TECHNOLOGY

The present invention relates to a power semiconductor component.

BACKGROUND

Power semiconductor components are often powered by high voltages. In many cases, there is interest in being able to use the voltage applied as the input variable for open or closed loop control electronics. Since such open or closed loop control electronics are expediently devised to handle just low voltages, the high voltage applied to the power semiconductor component has to be firstly converted into a signal corresponding to the high voltage, the signal then being applied to the open or closed loop control electronics.

This can be done by means of a resistive voltage divider, for instance, but which, however, has the drawback of a not inconsiderable power loss. Although to get round this problem capacitive voltage dividers can be used, here, however, dividing the voltage, especially when a DC voltage is applied, may tend to drift because of leakage currents, necessitating a defined discharge of the capacitances which complicates the matter.

SUMMARY

One aspect of the present invention is to provide a power semiconductor component which now makes it possible to deduce the voltage applied to the component without the need of a separate voltage divider. A further aspect involves providing a power semiconductor assembly with a corresponding power semiconductor component making it possible to deduce the electric voltage applied to the power semiconductor component. Yet another aspect is to define a method for operating a corresponding power semiconductor component.

A power semiconductor component as detailed hereinafter featuring an electric blocking capability exceeding 30 V comprises a semiconductor body, two load terminals and a potential probe. The electric blocking capability is the blocking voltage across the two load terminals which the component is capable of maintaining without a breakdown occurring. The potential probe is positioned to tap an electric intermediate potential at a tap location in the semiconductor body for an electric voltage applied across the two load terminals. Although the intermediate voltage is intermediate to the electric potentials of the two load terminals, it differs from each of the two potentials thereof. The tap location is selected so that the electric potential of the potential probe differs from at least one of the two electric potentials applied to the load terminals by maximally 100 V when the maximum blocking voltage is applied across the load terminals.

Combining one such power semiconductor component with a detector electrically conductively connected or connectable to the potential probe results in a power semiconductor assembly by means of which a qualitative or quantitative indication of the high voltage applied to the power semiconductor component is now achievable by analyzing the electric voltage without having to tap the full high voltage drop across the power semiconductor component.

In operating a power semiconductor component as explained above, the electric potentials applied to its load terminals differ. With the aid of the potential probe, a potential intermediate to the electrical potentials applied to the two load terminals is tapped.

Those skilled in the art will recognize additional features and advantages upon reading the following detailed description, and upon viewing the accompanying drawings.

BRIEF DESCRIPTION OF THE DRAWINGS

The invention can be better understood with reference to the following drawings and description. The components in the figures are not necessarily to scale, instead emphasis being placed upon illustrating the principles of the invention. Moreover, in the figures, like reference numerals designate corresponding parts. In the drawings.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top", "bottom", "front", "back", "leading", "trailing", etc., is used with reference to the orientation of the figure(s) being described. Because components of embodiments may be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

Figure 1:
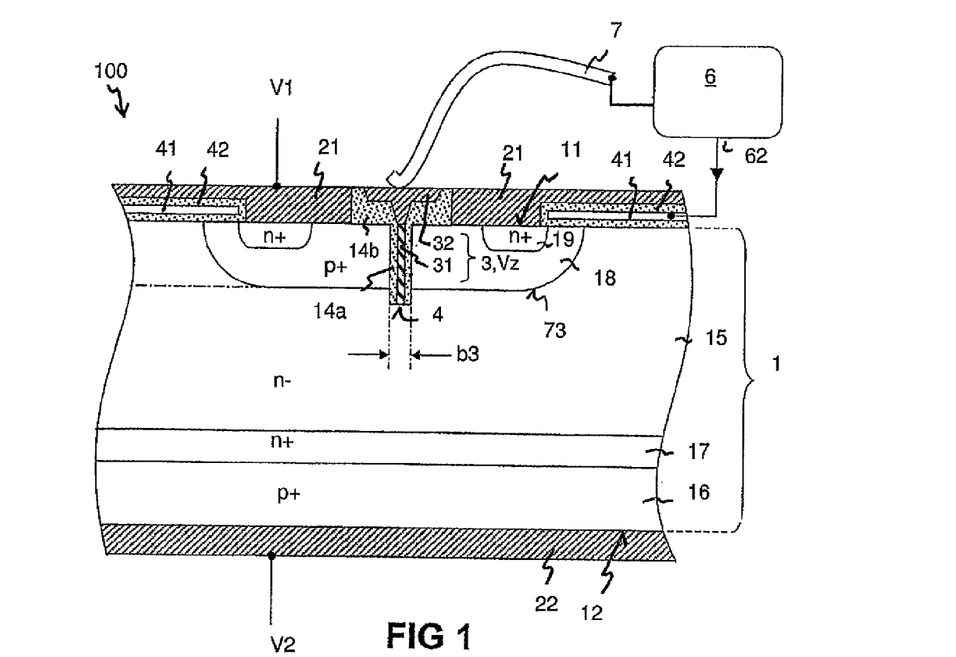
FIG. 1 is a vertical section through a power semiconductor component in the body of which a channel is formed into which a potential probe extends to tap the electric voltage existing at the end of the channel in the body of the semiconductor according to an embodiment.

Referring now to FIG. 1, there is illustrated, by way of example, a power semiconductor component 100 configured as an IGBT including a semiconductor body 1 made of silicon, silicon carbide or any other semiconductor material. The semiconductor body 1 comprises a front side 11 and opposite thereto a rear side 12. The power semiconductor component 100 comprises two load terminals 21 and 22 across which a current flow materializes from one of the load terminals 21, 22 through the semiconductor body 1 to the other load terminals 22, 21 at least in certain phases of operation of the power semiconductor component 100. This current flow may be altered, for example, where a transistor such as a MOSFET, an IGBT or a J-FET is concerned with the aid of a gate electrode of the power semiconductor component 100. In other components, such as a thyristor, the current may at least be turned on by firing the power semiconductor component 100 electrically or optically. Other suitable components, for example diodes, have no gate electrode. Depending on the type of component involved, the load terminals 21, 22 may be drain or source, emitter and collector or anode and cathode electrodes, the assignment being optional.

In the assembly as shown in FIG. 1, the power semiconductor component 100 is configured, for example, as an IGBT, it being understood, however, that any other power semiconductor component, particularly one as listed above is basically compatible.

To realize an IGBT structure, the semiconductor body 1 comprises, stacked on the rear side 12, a strongly p-doped emitter 16, a weakly n-doped drift zone 15, a strongly p-doped body zone 18 and a strongly n-doped source zone 19. Sandwiched between the body zone 18 and the drift zone 15 is a main pn junction 73. The first load terminal 21 contacts the source zones 19 at the front side 11 and the second load terminal 22 contacts the p emitter at the rear side 12. The main pn junction of a component in the sense of the present application is understood to be the pn junction of the component via which, when ON, the load current of the component flows and at which, when OFF, a wide space charge zone forms inhibited by a load current. For example, in a diode the main pn junction is formed between a p-doped anode zone and an n-doped cathode zone, whereas in a thyristor it is formed between a p-doped base and an n-doped base.

For gating the current across the load terminals 21 and 22, a gate electrode 41 is provided which is electrically isolated from the semiconductor body 1 and from the load terminals 21, 22 by means of a dielectric 42.

Applying in operation of the component 100, a first electric potential V1 to the first load terminal 21 and a second electric potential V2 different than the first electric potential V1 to the second load terminal 22 produces an electric field in the semiconductor body 1 which may be described by way of equipotential surfaces, to each of which a certain electric potential may be assigned. The electric potentials assigned to these equipotential surfaces lie between the electric potentials V1 and V2. The potentials V1 and V2 are attained only at the front side 11 and rear side 12 respectively. An electric potential of the semiconductor body 1 differing from the potentials V1 and V2 applied to the load terminals 21 and 22 respectively but which is intermediate thereto is termed intermediate potential Vz.

The present invention provides for such an intermediate potential Vz in making use of the fact that it relates to the electric potentials V1 and V2 applied to the load terminals 21 and 22 respectively in thus now making it possible to obtain a qualitative or quantitative indication of the voltage drop across the load terminals 21 and 22 as long as the intermediate potential Vz is analyzed relative to some other suitable electric potential of the component 100. As the reference potential for this purpose, the potential V1 of the first load terminal 21 or the potential V2 of the second load terminal 22 may be employed, for example.

Provided to tap the intermediate potential Vz in the assembly as shown in FIG. 1 is a potential probe 3 featuring a portion 31 sited in a channel configured in the semiconductor body 1 to tap at a tap location 4 of the semiconductor body 1 an intermediate potential Vz. For this purpose, the channel and the portion 31 may extend substantially perpendicular to the front side 11 into the semiconductor body 1, for example. The tap location 4 is sited at the lowest point of the channel. Sideways, the portion 31, which may be made, e.g., of a polycrystalline semiconductor material or of metal, is insulated from the semiconductor body 1 by means of a dielectric 14a so that an electrically conductive connection exists between the portion 31 and the semiconductor body 1 only at the bottom end of the channel, i.e., at the tap location 4.

To detect the intermediate potential Vz, for example, by means of a detector 6, the potential probe 3 comprises a bond pad 32 to which an electric connecting element 7, e.g., a bond wire, is bonded that is, or may be, electrically conductive connected to the detector 6. The bond pad 32 may have a footprint at least 50 µm×50 µm. It is appreciated that the connection between the bond wire 7 and the detector 6 is shown merely diagrammatically, in other words, the bond wire 7 need not necessarily be directly joined to the detector 6 as shown. To electrically isolate the bond pad 32 from the front side 11 of the semiconductor body 1, a dielectric 14b is disposed additionally between the bond pad 32 and the semiconductor body 1.

Whilst the potential difference across the load terminals 21 and 22, when the component 100 is ON, may be typically just a few volts as may be directly detected by a conventional low voltage electronics, in the blocking state of the component 100, it may be a few 100 volts, a few 1000 volts or even exceed 10,000 volts. The design of the component 100 governs its maximum permissible blocking voltage which, should it be exceeded, may result in the component 100 being damaged or even ruined. Avoiding this, is possible by monitoring the intermediate potential Vz at the tap location 4 to obtain from the detected intermediate potential Vz a first qualitative or quantitative indication of the potential difference V1−V2 across the load terminals 21 and 22 and, should the voltage applied across the load terminals 21 and 22 exceed or pose a risk of exceeding the maximum permissible voltage, corrective action may be taken to reduce or turn off the voltage applied across the load terminals 21 and 22.

Such a corrective action may involve, for instance, evaluating the intermediate potential Vz detected by the detector 6 and activating the component 100 fully or partly to boost the conductivity thereof when there is a risk of the maximum permissible blocking voltage across the load terminals 21 and 22 being exceeded. For this purpose, the detector 6 may feature an output 62 which is, or may be, coupled to a gate electrode 41 of the component 100. In the present example embodiment, this electrode is the gate electrode 41, but in other components, such a gate electrode may be, for example, a base or trigger electrode, it being just as possible to provide instead of a gate electrode any other gating means, for example, a light-firing structure.

It is particularly with a vertical power semiconductor component 100 as shown in FIG. 1 that there is no problem in inserting a potential probe 3 including a portion 31 extending into the channel included in the semiconductor body 1. Depending on the maximum permissible blocking voltage across the load terminals 21 and 22 and the geometry and doping of the various semiconductor zones 15, 16, 17, 18, 19 of the power semiconductor component 100 limiting the intermediate potential Vz detected as a maximum with the potential probe 3 may be set to a value, as is directly detectable by conventional low voltage electronics, simply by selecting the depth of the channel defining the site of the tap location 4.

Suitably selecting the site of the tap location 4 now makes it possible to achieve that the intermediate potential Vz for a maximum permissible blocking voltage of the potential V1 of the first load terminal 21 and/or the potential of the second load terminal 22 does not differ by more than a prescribed value, for example 30V, in thus making it possible to be simply detected by a detector 6 as is realized by conventional low voltage electronics in detecting the potential difference between the intermediate potential Vz and the potential V1 and/or V2.

In the assembly as shown in FIG. 1, the potential probe extends from the front side 11 into the semiconductor body 1. However, it is just as possible instead, or as an alternative thereto, that the potential probe 3 extends correspondingly from the rear side 12 or from a side edge of the semiconductor body 1 into the semiconductor body 1. In the example embodiment as shown in FIG. 1, the tap location 4 is in the drift zone 15. However, again, it is just as possible that it may be sited in any other semiconductor zone 16, 17 or 18.

Figure 2:
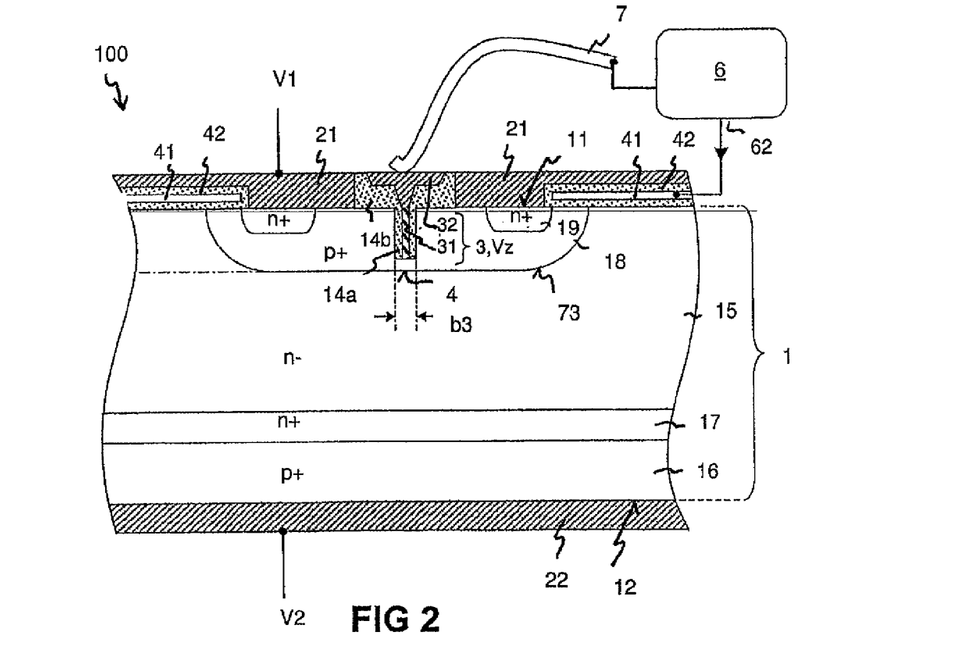
FIG. 2 is a vertical section through a power semiconductor component structured the same as the power semiconductor component as shown in FIG. 1 except that the end of the potential probe extends into the semiconductor body not as far as the main pn junction.
Figure 3:
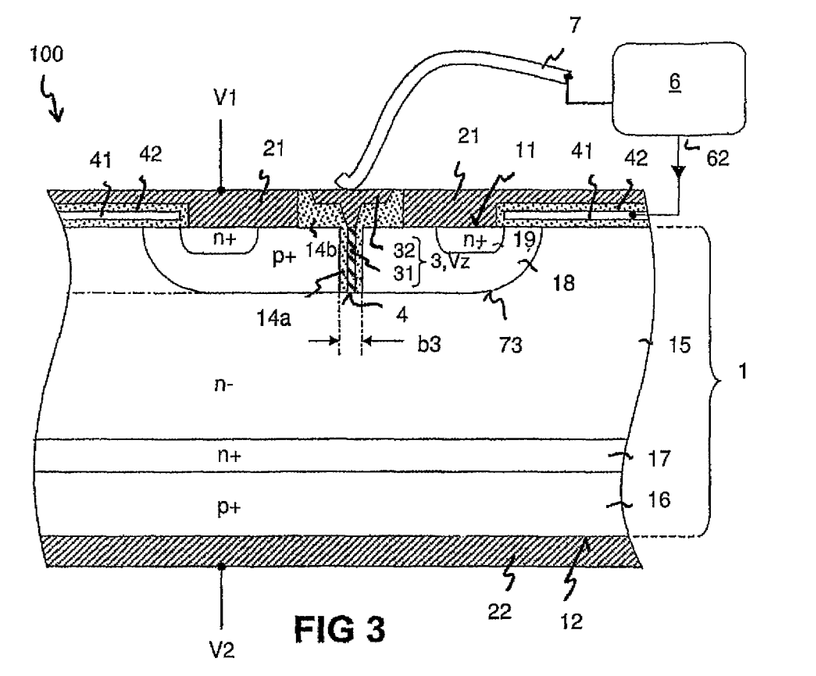
FIG. 3 is a vertical section through a power semiconductor component structured the same as the power semiconductor component as shown in FIGS. 1 and 2 except that the end of the potential probe extends up to the main pn-junction.

In the assembly as shown in FIG. 1, the tap location 4 which is spaced away from the main pn junction 73, is sited in the body zone 18 bordering the main pn junction 73. As shown in FIG. 2, the tap location 4 when sited spaced away from the main pn junction 73 may also be sited in the drift zone 15 bordering the main pn junction 73. In another aspect, as shown in FIG. 3, the tap location may be directly sited at the main pn junction 73.

Figure 4:
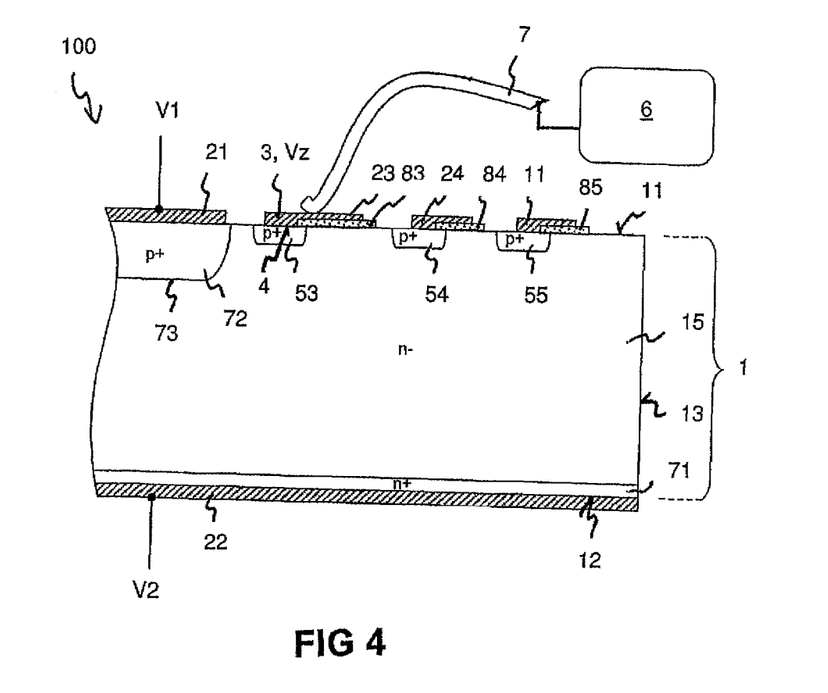
FIG. 4 is a vertical section through an edge region of a power semiconductor component according to another embodiment, the edge termination structure of which includes a field plate at which the electric voltage may be tapped.

Referring now to FIG. 4, there is illustrated a further example embodiment as a vertical section through a side edge region of a diode, the semiconductor body 1 of which comprises a weakly n-doped drift zone 15 in which a strongly p-doped zone 72 is embedded and extending thereinto from the front side 11 of the semiconductor body 1. The strongly p-doped zone 72 forms with the drift zone 15 a main pn junction 73.

To reduce the electric field emanating from this main pn junction 73 as evenly as possible whilst simultaneously preventing an prohibitive field surge, particularly at the front side 11 of the semiconductor body 1, an edge structure including field plates 23, 24, 25 is disposed between the first load terminal 21 and the side edge 13 of the semiconductor body 1 at the front side 11 of the latter. To electrically connect the field plates 23, 24, 25, a field ring 53, 54 and 55, respectively, each doped complementary to the drift zone 15 is provided extending up to the front side 11 where it is connected to the corresponding field plate 23, 24 or 25. The field plates 23, 24, 25 are additionally electrically isolated by means of a dielectric 83, 84 and 85 respectively from the drift zone 15. The field plates 23, 24, 25 are electrically conductive and may be made, e.g., of a metal or polycrystalline Hall effect material.

In the blocking state of the component 100, each of the field plates 23, 24, 25 has an electric potential differing from the electric potential V1 of the load terminal 21, from the electric potential V2 of the load terminal 22 as well as from the electric potentials of the other field plates 23, 24, 25. Each of the electric potentials of the field plates 23, 24, 25 thus represents an intermediate potential in the sense of the present invention. In the component 100, as shown in FIG. 4, for instance, the potential of the field plates 23 nearest to the load terminal 21 is used as the intermediate potential Vz. The tap location 4 is given by the contact pad between the field plate 23 and the field ring 53.

To feed an intermediate potential Vz of a component 100 to a detector 6, an electrically conductive connection is needed between the potential probe 3 and the detector 6 as may be done, for example, by means of a bond wire 7 bonded to the potential probe 3.

Figures 5, 6:
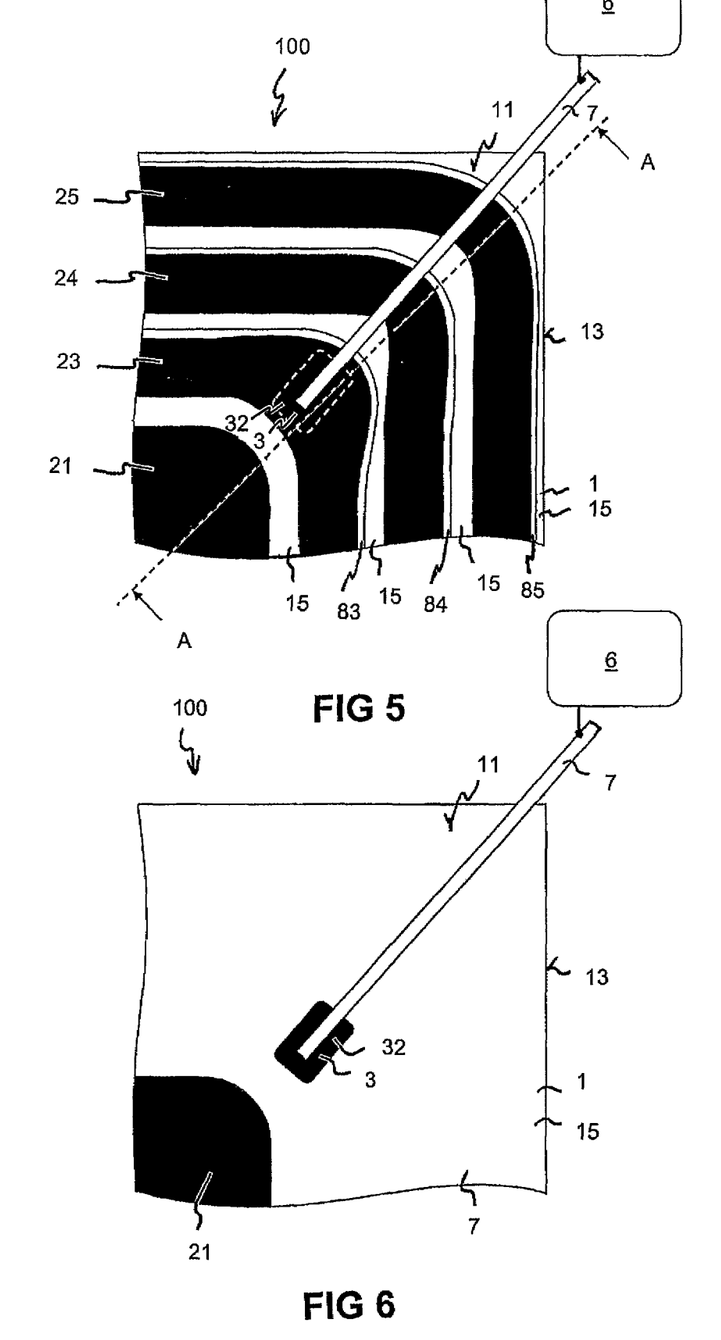
FIG. 5 is a top-down view of the assembly as shown in FIG. 2.
FIG. 6 is a top-down view of a section of a power semiconductor component according to yet another embodiment, the body of which is metalized in the edge region of a pn junction as a potential probe.

In the top-down view of the front side 11, as shown in FIG. 5, there is illustrated how for this purpose the potential probe 3 comprises a bond pad 32 integrated in the field plate 23. For this purpose, the field plate 23 has a locally widened lateral portion.

Referring now to FIGS. 4 and 5, there is illustrated how, by way of an example, the intermediate potential Vz may be correspondingly tapped not just from the field plate 23 but, if necessary, also from any of the other field plates 24 or 25, e.g., by means of a bond wire. It is likewise possible to advantageously tap the potential in the edge region with the aid of a field plate structure at the site of the pn junction. Otherwise, a field plate structure different to that as explained with reference to FIGS. 4 and 5 may comprise instead of the three field plates 23, 24, 25 as shown just one, two or more than three field plates 23, 24, 25 each of which may be employed as explained as a potential probe, as long as its anticipated intermediate potential Vz is suitable in size. Apart from this, a field plate structure may be employed not just in diodes but also in other components.

To produce a potential probe 3 in the present example embodiment, a bond pad 32 is integrated in a field plate structure of the component 100. However, it is understood that a potential probe 3 for tabbing an intermediate potential Vz by means of a bond pad 32 is not tied to a field plate structure 23, 24, 25. An example of this is evident from a modified component as shown in the top-down view of FIG. 6 provided with no field plate structure. In this case, just one potential probe 3 configured as a metallic bond pad 32 is applied to the front side 11 of the semiconductor body 1 between the load terminal 21 and the side edge 13 of the semiconductor body 1 at the front side 11. A structure such as this is particularly of advantage when the voltage drop across the edge region is symmetricized with the aid of a weakly conductive layer (e.g., with an a-C: H cover). In this case, the intermediate potential Vz would correspond to that of the resistive voltage divider of the edge structure at the tap location.

It is likewise just as possible in a component including a field plate structure to apply to the semiconductor body 1a simple bond pad 32 not configured as a ring-shaped field plate surrounding the load terminals 21 as the potential probe between adjacent field rings or between the first load terminal 21 and the field plate nearest to the first load terminal 21, or between the field plate farthest from the first load terminal 21 and the side edge 13 of the semiconductor body 1.

Figure 7:
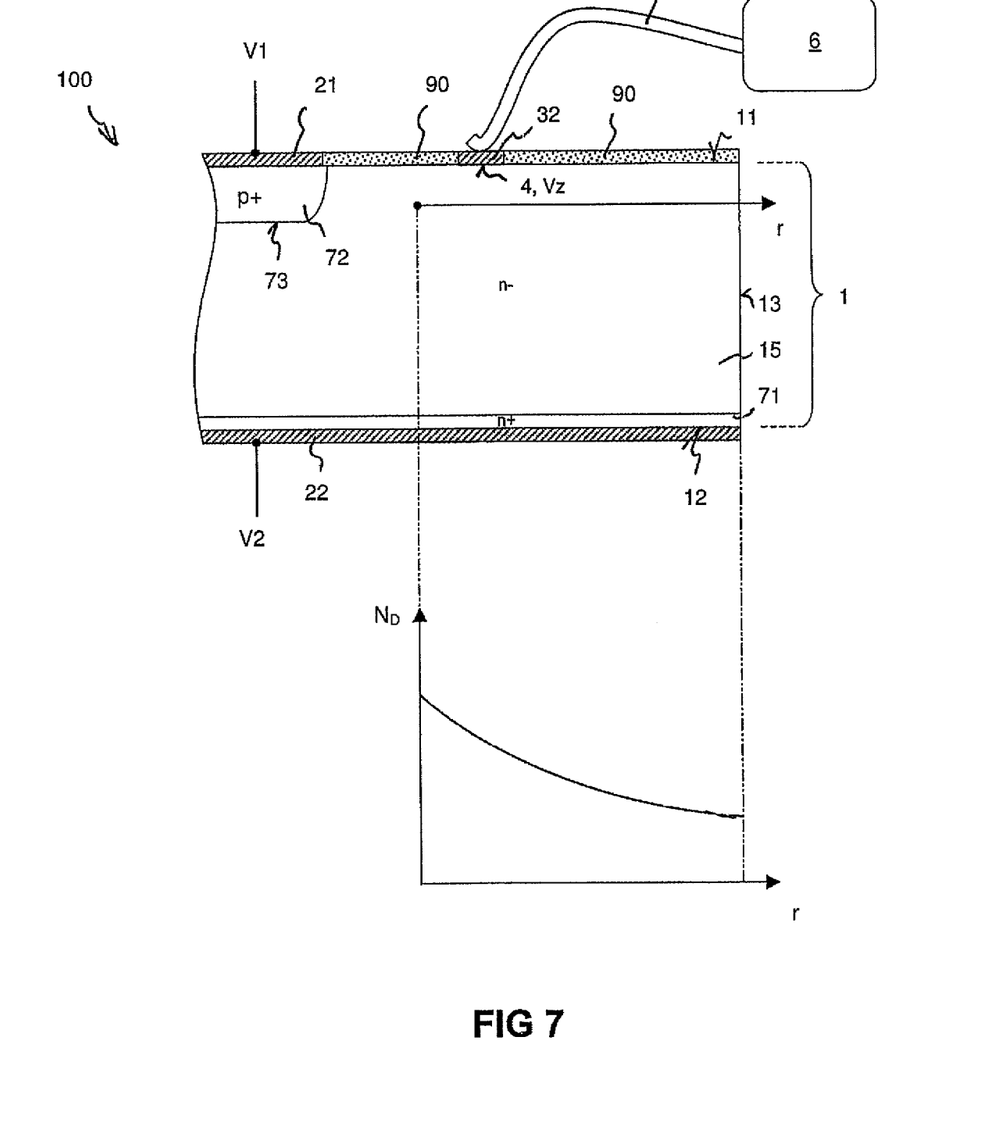
FIG. 7 is a vertical section through a power semiconductor component comprising a variable lateral doping edge termination siting the tap location according to an embodiment.

Referring now to FIG. 7, there is illustrated, like FIG. 4, a diode whose edge termination comprises instead of a field ring field plate structure (53, 54, 55, 23, 24, 25 in FIG. 4), a variable lateral doping (VLD) edge termination, i.e., an edge termination in which the degradation of the net dopant (ND) concentration of the drift zone 15 is at least sectionwise monotonously, or rigidly monotonously, from the main pn junction 73 in the lateral direction r to the side edge 13 of the semiconductor body 1 as is illustrated by the profile of the net dopant concentration ND as shown below in FIG. 7. To avoid unwanted voltage surges at the front side 11 of the semiconductor body 1, a resistive layer 90 is applied to the edge region on the front side 11. One such resistive layer 90 may comprise, for example, a conductivity of less than 10E-7 S, furthermore, it may be configured, e.g., as an a-C:H layer, in other words as a layer of hydrogen-doped amorphous carbon. Such a resistive layer 90 may be produced with a defined edge region and thus function as a voltage divider. In a recess of such a resistive layer 90, the tap location 4 of a potential probe, for example in the form of a bond pad 32, may be sited at which the intermediate potential Vz depends on how the resistive layer 90 is structured, in being influenced thereby. Thus, the specific electric resistance and/or a thickness of the resistive layer 90 may be tailored to meet requirements, they, each independent of the other, being selected constant or variable.

A space charge zone forms at the main pn junction 73 in the blocking state of a bipolar component 100 as explained above, for example, with reference to FIGS. 1 to 7. The width of this space charge zone increases the higher the blocking voltage. Outside of the space charge zone, the gradient of the electric field in the semiconductor body 1 is very small, i.e., the change in the edge region there is merely minimal as compared to the change in the edge region within the space charge zone. When, as shown in FIGS. 1 and 2, the tap location 4 is sited spaced away from the main pn junction 73, applying a very small blocking voltage results in a very narrow space charge zone initially forming across the load terminals 21 and 22 which is yet to effect the tap location 4. This is why there is hardly any change in the intermediate potential Vz detected by the potential probe 3.

There is no significant change in the intermediate potential Vz until the space charge zone effects the tap location 4 with increasing blocking voltage. This is why it is of advantage, when the potential probe 3 is intended to detect even minor differences in the potential across the load terminals 21 and 22, to site the tap location 4 very near or directly at the main pn junction 73.

If the important thing is just to detect higher differences in potential across the load terminals 21 and 22, for example, to protect the component 100 from an imminent overvoltage, a larger spacing between the tap location 4 and the main pn junction 73 may be sufficient.

Irrespective of where the tap location 4 of the potential probe 3 is sited in a bipolar component 100 (for instance buried vertical in the semiconductor body 1 as shown in FIGS. 1 to 3 or, e.g., in the edge region at the front side 11 of the semiconductor body 1 as shown in FIGS. 4 to 7) structuring the power semiconductor component 100 in the region of the tap location 4 is governed by the following considerations. When the potential probe as explained above is sited precisely at the location of the main pn junction 73 then, as regards the load terminal 21 and/or the load terminal 22 for each external blocking voltage V2−V1 other than zero as applied between load terminals 21 and 22, a voltage Vz−V1 or V2−Vz is detected which in a first approximation is proportional to the voltage V2−V1. The proportionality factor is dictated by the dopant concentration of the semiconductor zones between which the main pn junction 73 is formed. In a first approximation:

$$V_z - V1 \propto \frac{N21}{N22} \cdot (V2 - V1)$$

where N21 and N22 are the net dopant concentrations of the semiconductor zones between which the main pn junction 73 is configured and wherein the semiconductor zone thereof, which is lesser spaced away from the load terminal 21, comprises the net dopant concentration N1 and the other comprises the net dopant concentration N2.

The lower of the two net dopant concentrations is the determining factor for the blocking capability of the component 100. When the intermediate potential Vz with respect to the load terminals 21 or 22 facing the higher net dopant concentration (the first load terminal 21 in the FIGS. 1 to 4 because of net dopant concentration of the body zone 18 or strongly p-doped zone 72 being higher as compared to the drift zone 15) is analyzed, then by suitably selecting the net dopant concentration of the semiconductor zone having the higher net dopant concentration the potential difference Vz−V1 may be limited to a maximum, e.g., of 100 V or 50 V or 30 V.

Limiting it in this way may also be achieved with a field stop layer 17 as shown in FIGS. 1 to 3, for instance, (i.e., a layer sequence structured p/n−/n+, for example) but with Vz−V1 no longer being proportional to the external voltage V2−V1 by the field effect of the field stop layer 17.

Siting the tap location 4 of the potential probe 3 spaced away from the main pn junction 73 results in—relative to the one of the two load terminals 21, 22 arranged in the semiconductor zone forming the main pn junction 73 siting the tap location 4—a limit voltage (V2−V1)min below which (practically) no potential difference Vz−V1 is detected. It is in this way that by suitably selecting the site of the tap location 4 a potential difference significantly differing from zero is achievable not before above a limit voltage applied across the two load terminals 21 and 22. This limit voltage corresponds to the voltage across the load terminals 21 and 22 at which the space charge zone attains the tap location 4.

As explained above, the intermediate potential Vz at the tap location 4 of a potential probe is a function of the net dopant concentration of the zones of the semiconductor body 1 involved, with bipolar components 100 particularly a function of the net dopant concentrations of the semiconductor zones 15 and 18 or 72 configuring the main pn junction 73. To compensate fluctuations in fabrication of the component due to the process involved, the net dopant concentration may be subsequently adapted in all or some of these semiconductor zones by, for example, implanting protons in the semiconductor body 1 to tweak the net dopant concentration in the implantation zone by means of subsequent tempering of the semiconductor body 1 at a suitable temperature.

In all aspects of the invention, the tap location may be spaced away from the two load terminals 21 and 22. For example, the spacing between the tap location 4 and each of the two load terminals 21 and 22 may exceed 2 μm. Furthermore, the spacing between the tap location 4 and at least one of the two load terminals 21, 22 may be smaller than 100 μm. The potential probe 3 may comprise an electrical conductivity exceeding 10 μS (S=Siemens), for example.

It is understood that while the basic principle of the invention was explained above by way of concrete examples, modifications thereof are, of course, possible. Especially, a semiconductor component may comprise instead of just one potential probe two or more such potential probes, the type of which may vary within a semiconductor component in forming any optional combination thereof. Where at least two potential probes are employed the potential difference V2−V1 across the load terminals may also be found by detecting the difference between the intermediate potentials of two potential probes.

The present invention may apply to all kinds of power semiconductor components, e.g., to vertical or lateral power semiconductor components.

Although various examples to realize the invention have been disclosed, it will be apparent to those skilled in the art that various changes and modifications may be made which will achieve some of the advantages of the invention without departing from the spirit and scope of the invention. It will be obvious to those reasonably skilled in the art that other components performing the same functions may be suitably substituted. Such modifications to the inventive concept are intended to be covered by the appended claims.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. A power semiconductor component featuring an electric blocking capability exceeding 30 V comprising:
   a semiconductor body;
   two load terminals; and
   a potential probe positioned to tap an intermediate electric potential of the semiconductor body at a tap location within the semiconductor body for an electric voltage applied across the two load terminals, said intermediate electric potential being intermediate to the electric potentials of the two load terminals, but differing from each of the two electric potentials of the two load terminals, wherein said potential probe comprises a portion extending into the semiconductor body and a dielectric insulating the portion from the semiconductor body so that an electrically conductive connection between the portion and the semiconductor body can exist only at the tap location within the semiconductor body;
   wherein the tap location is selected so that the electric potential of the potential probe differs from at least one of the two electric potentials applied to the load terminals by maximally 100 V when the maximum blocking voltage is applied across the load terminals.

2. The power semiconductor component as set forth in claim 1 wherein the tap location is selected so that the electric potential of the potential probe differs from at least one of the two electric potentials applied to the load terminals by maximally 30 V when the maximum blocking voltage is applied across the load terminals.

3. The power semiconductor component as set forth in claim 1 wherein the tap location is sited spaced away from each of the load terminals.

4. The power semiconductor component as set forth in claim 3 wherein the spacing between the tap location and each of the two load terminals is greater than 2 μm, smaller than 100 μm or both.

5. The power semiconductor component as set forth in claim 1 wherein in the semiconductor body are arranged:
   a first semiconductor zone of a first conductivity type in ohmic contact with the first load terminal;
   a second semiconductor zone of a second conductivity type complementary to the first conductivity type in ohmic contact with the second load terminal;
   wherein said semiconductor component comprises a bipolar main pn junction configured between the first semiconductor zone and the second semiconductor zone; and
   wherein either the first semiconductor zone is p-conductive and the second semiconductor zone is n-conductive, or wherein the first semiconductor zone is n-conductive and the second semiconductor zone is p-conductive.

6. The power semiconductor component as set forth in claim 5 wherein the tap location is sited at the main pn junction or is spaced away from the main pn junction.

7. The power semiconductor component as set forth in claim 5 wherein the tap location is sited spaced away from the pn junction either in the first semiconductor zone or in the second semiconductor zone.

8. The power semiconductor component as set forth in claim 1 wherein the potential probe comprises a portion sited in a channel configured in the semiconductor body.

9. The power semiconductor component as set forth in claim 8 comprising a dielectric disposed between the potential probe and a sidewall of the channel.

10. The power semiconductor component as set forth in claim 8 wherein the tap location is sited at the lowest point of the channel.

11. The power semiconductor component as set forth in claim 1 wherein the potential probe comprises a bond pad sited on the semiconductor body, and a dielectric layer is disposed between the bond pad and the semiconductor body.

12. A power semiconductor assembly comprising:
   a power semiconductor component featuring an electric blocking capability exceeding 30 V comprising:
      a semiconductor body;
      two load terminals; and
      a potential probe positioned to tap an intermediate electric potential of the semiconductor body at a tap location within the semiconductor body for an electric voltage applied across the two load terminals, said intermediate electric potential being intermediate to the electric potentials of the two load terminals, but differing from each of the two electric potentials of the two load terminals, said potential probe comprising a portion extending into the semiconductor body and a dielectric insulating the portion from the semiconductor body so that an electrically conductive connection between the portion and the semiconductor body can exist only at the tap location within the semiconductor body; and
   an electric connecting element electrically conductively connected to the potential probe.

13. The power semiconductor assembly as set forth in claim 12 wherein the electric connecting element is configured as a bond wire.

14. The power semiconductor assembly as set forth in claim 12 including a detector electrically conductively connected or connectable to the potential probe.

15. The power semiconductor assembly as set forth in claim 14 wherein at least one of the load terminals is electrically conductively connected or connectable to the detector.

16. The power semiconductor assembly as set forth in claim 14 wherein the detector is operable to trigger an open or closed loop control action as a function of the potential difference between the electric potential of one of the load terminals and the intermediate electric potential.

17. A method of operating a power semiconductor component comprising:
   providing a power semiconductor component featuring an electric blocking capability exceeding 30 V comprising:
      a semiconductor body;
      two load terminals; and
      a potential probe positioned to tap an intermediate electric potential of the semiconductor body at a tap location within the semiconductor body for an electric voltage applied across the two load terminals, said intermediate electric potential being intermediate to the electric potentials of the two load terminals, but differing from each of the two electric potentials of the two load terminals, wherein said potential probe comprises a portion extending into the semiconductor body and a dielectric insulating the portion from the semiconductor body so that an electrically conductive connection between the portion and the semiconductor body can exist only at the tap location within the semiconductor body;

applying differing electric potentials to the two load terminals; and tapping by means of the potential probe a potential intermediate to the electric potentials applied to the two load terminals.

18. The method as set forth in claim 17 further comprising triggering an open or closed loop control action as a function of a potential difference or a change in the potential difference between the potential of one of the load terminals and the intermediate electric potential.

19. The method as set forth in claim 18 comprising rendering the power semiconductor component conducting, diminishing the magnitude of the potential difference between the electric potentials applied to the load terminals, or both when the potential difference or the change in the potential difference attains or exceeds a predefined value.

* * * * *